(12) United States Patent
Park et al.

(10) Patent No.: US 8,461,656 B2
(45) Date of Patent: Jun. 11, 2013

(54) DEVICE STRUCTURES FOR IN-PLANE AND OUT-OF-PLANE SENSING MICRO-ELECTRO-MECHANICAL SYSTEMS (MEMS)

(75) Inventors: Woo Tae Park, Singapore (SG); Lisa H. Karlin, Chandler, AZ (US); Lianjun Liu, Chandler, AZ (US); Heinz Loreck, Tempe, AZ (US); Hemant D. Desai, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 133 days.

(21) Appl. No.: 12/827,848

(22) Filed: Jun. 30, 2010

(65) Prior Publication Data
US 2012/0001277 A1    Jan. 5, 2012

(51) Int. Cl.
*H04R 23/00* (2006.01)
(52) U.S. Cl.
USPC ........... 257/418; 257/254; 257/414; 257/415; 257/417; 257/419; 257/420; 257/E29.324
(58) Field of Classification Search
USPC ................ 257/254, 414, 415, 417, 418, 419, 257/420, E29.324
See application file for complete search history.

(56) References Cited

U.S. PATENT DOCUMENTS

| | | | |
|---|---|---|---|
| 6,535,318 B1 * | 3/2003 | Wood et al. | 359/225.1 |
| 6,939,473 B2 | 9/2005 | Nasiri et al. | |
| 7,585,744 B2 * | 9/2009 | Gogoi et al. | 438/422 |
| 7,696,587 B2 * | 4/2010 | Watanabe et al. | 257/415 |
| 7,919,006 B2 * | 4/2011 | Park et al. | 216/88 |
| 8,119,431 B2 * | 2/2012 | Park et al. | 438/50 |
| 8,316,718 B2 | 11/2012 | Lin et al. | |
| 2008/0093685 A1 * | 4/2008 | Watanabe et al. | 257/415 |

OTHER PUBLICATIONS

U.S. Appl. No. 11/932,099, filed Oct. 31, 2007.
U.S. Appl. No. 12/632,940, filed Dec. 8, 2009.

* cited by examiner

*Primary Examiner* — Andy Huynh
(74) *Attorney, Agent, or Firm* — James L. Clingan, Jr.

(57) ABSTRACT

A device structure is made using a first conductive layer over a first wafer. An isolated conductive region is formed in the first conductive layer surrounded by a first opening in the conductive layer. A second wafer has a first insulating layer and a conductive substrate, wherein the conductive substrate has a first major surface adjacent to the first insulating layer. The insulating layer is attached to the isolated conductive region. The conductive substrate is thinned to form a second conductive layer. A second opening is formed through the second conductive layer and the first insulating layer to the isolated conductive region. The second opening is filled with a conductive plug wherein the conductive plug contacts the isolated conductive region. The second conductive region is etched to form a movable finger over the isolated conductive region. A portion of the insulating layer under the movable finger is removed.

16 Claims, 9 Drawing Sheets

DEVICE STRUCTURES FOR IN-PLANE AND OUT-OF-PLANE SENSING MICRO-ELECTRO-MECHANICAL SYSTEMS (MEMS)

BACKGROUND

1. Field

This disclosure relates generally to methods for making micro-electro-mechanical systems (MEMS), and more specifically, to methods for making in-plane and out-of-plane sensing MEMS.

2. Related Art

Increasingly MEMS are used as accelerometers and gyroscopes in consumer electronic devices and automobiles. Many MEMS include capacitive electrodes and circuitry to detect a change in the capacitance associated with the capacitive electrodes. Certain types of MEMS may utilize differential capacitance between two capacitors formed as part of MEMS. Some MEMS may further be capable of sensing and actuating both in-plane and out-of-plane.

Traditional processes to form these types of MEMS have been costly and inefficient. Accordingly, there is a need for improved methods for making MEMS that sense and actuate in both in-plane and out-of-plane.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a method making a device structure is provided. The method may include forming a first conductive layer over a first wafer and forming an isolated conductive region in the first conductive layer surrounded by a first opening in the conductive layer. The method may further include providing a second wafer comprising a first insulating layer and a conductive substrate, wherein the conductive substrate has a first major surface adjacent to the first insulating layer. The method may further include attaching the first insulating layer to the isolated conductive region and thinning the conductive substrate to form a second conductive layer. The method may further include forming a second opening through the second conductive layer and the first insulating layer to the isolated conductive region. The method may further include filling the second opening with a conductive plug wherein the conductive plug contacts the isolated conductive region. The method may further include etching the second conductive region to form a movable portion of the device structure over the isolated conductive region. The method may further include removing a portion of the first insulating layer under the movable portion of the device structure.

In another aspect, a device structure including a substrate is provided. The device structure may include an insulating layer on the substrate and a conductive layer having an isolated conductive region separated from the conductive layer by an opening in the conductive layer that surrounds the isolated conductive region. The device structure may further include an insulating layer over the isolated conductive layer having an opening over the isolated conductive region. The device structure may further include a movable conductive finger over the opening in the insulating layer that forms a first capacitor with the isolated conductive layer that varies in capacitance based on movement of the movable finger. The device structure may further include conductive polysilicon running directly from a location on the isolated conductive layer to a bonding feature above a top surface of the device structure, wherein the conductive polysilicon is orthogonal to a top surface of the isolated conductive layer.

In yet another aspect, a method of forming a device structure is provided. The method may include forming a first insulating layer over a semiconductor substrate and forming a conductive polysilicon layer over the first insulating layer. The method may further include forming an opening in the polysilicon layer surrounding a first portion of the conductive polysilicon layer. The method may further include forming a conductive silicon layer over the conductive polysilicon layer, wherein the conductive silicon layer is separated from the conductive polysilicon layer by a second insulating layer. The method may further include forming an opening extending orthogonally from a top surface of the first portion of the conductive polysilicon layer through the conductive silicon layer and the second insulating layer. The method may further include filling the opening in the silicon layer and the second insulating layer with conductive polysilicon. The method may further include etching the conductive silicon layer to form a plurality of movable fingers over the first portion of the conductive polysilicon layer. The method may further include removing the second insulating layer under the plurality of movable fingers.

Figure 1:
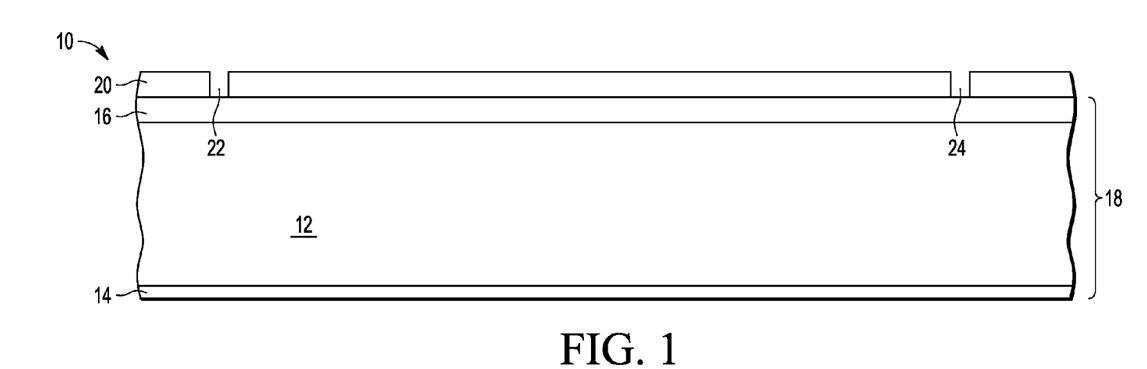
FIGS. 1-11 are cross-section views of a device structure during various stages of processing.

FIG. 1 is a cross-section view of a device structure 10 during a stage of processing. Device structure 10 may be formed by growing an insulating layer 14 on a substrate 12. Another insulating layer 16 may be formed on the opposite surface of substrate 12. In one embodiment, the combination of substrate 12, insulating layer 14, and insulating layer 16 is referred to as a wafer 18. By way of example, insulating layer 14 and insulating layer 16 may be oxide layers. A polysilicon layer 20, which may be doped, may be deposited on top of insulating layer 16. Alternatively, prior to depositing polysilicon layer 20, insulating layer 16 may be etched to define a mold for polysilicon. And, then polysilicon layer 20 may be formed in the mold. In addition, polysilicon layer 20 may be etched back. In addition, an insulating material, such as oxide may be deposited over polysilicon layer 20 and may be planarized. Polysilicon layer 20 may be etched to form openings 22 and 24. As explained later, the formation of openings 22 and 24 may define a bottom electrode of a capacitor. Although the plural form, openings, is used to refer to openings 22 and 24, it may be just one contiguous opening that surrounds a portion of polysilicon layer 20. As an example, the portion of polysilicon layer 20 that is remaining between openings 22 and 24 is also referred to as an isolated conductive region. Although FIG. 1 shows only two openings, additional openings may be formed to define routing interconnects. Additionally, although FIG. 1 shows a specific number of layers arranged in a certain order, device structure 10 may include additional or fewer layers arranged differently.

The substrate described herein can be any semiconductor material or combinations of materials, such as gallium arsenide, silicon germanium, silicon-on-insulator (SOI), polysilicon, monocrystalline silicon, the like, and combinations of the above.

Figure 2:
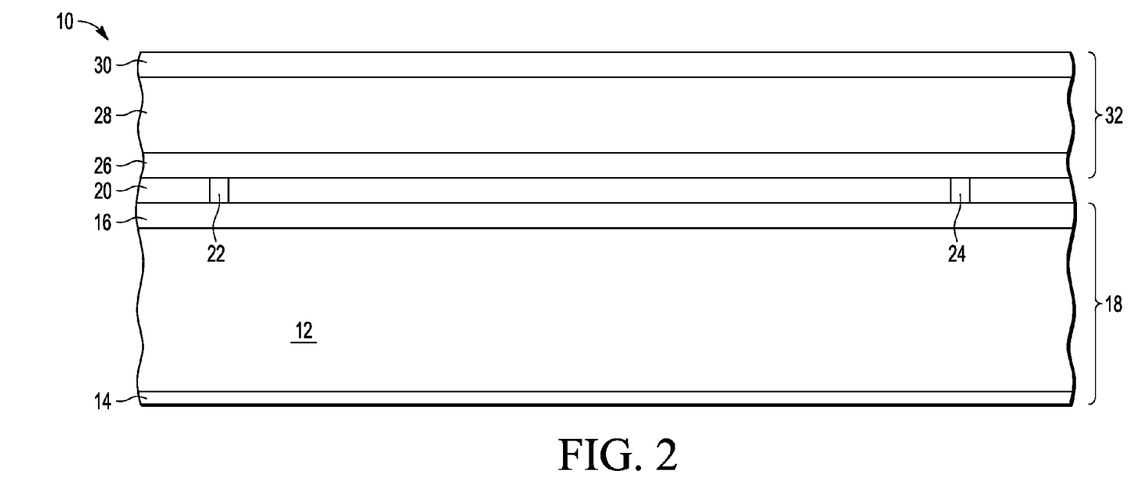

FIG. 2 shows device structure 10 during the next processing stage. A wafer 32 may be attached to wafer 18. In one embodiment, wafer 32 may be bonded to wafer 18 using fusion bonding. Wafer 32 may include substrate 28. Prior to bonding wafer 32 to wafer 18, a surface of wafer 32 may be oxidized to form an insulating layer 26. Insulating layer 26 when bonded with polysilicon layer 20 may leave openings 22 and 24 open. The top portion of wafer 32 may be thinned (ground and polished) to a desired MEMS device layer thickness. The top portion of thinned wafer 32 may be oxidized to form another insulating layer 30. By way of example, insulating layer 26 and insulating layer 30 may be oxide layers.

Figure 3:
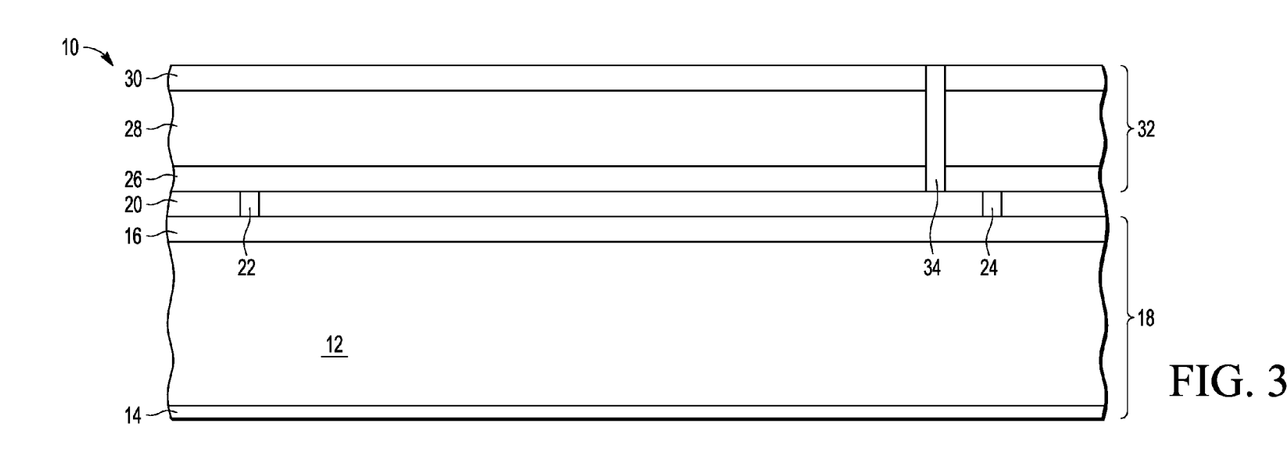

Next, as shown in FIG. 3, a conductive plug, such as an inter-layer via 34 may be formed. Inter-layer via 34 may be formed by patterning and etching insulating layer 26, substrate 28, and insulating layer 30. Substrate 28 is also referred to as a conductive silicon layer. In one embodiment, inter-layer via 34 may be formed by filling an opening with polysilicon. Thus, as an example, the processing steps in FIG. 3 may relate to forming a conductive silicon layer, such as substrate 28, over polysilicon layer 20, where polysilicon layer 20 is separated from substrate 28 by insulating layer 26. Inter-layer via 34 may be formed in an opening that extends orthogonally from a top surface of a portion of polysilicon layer 20 through conductive layer 28 and insulating layer 26. Although FIG. 3 shows only one inter-layer via, additional vias may also be formed.

Figure 4:
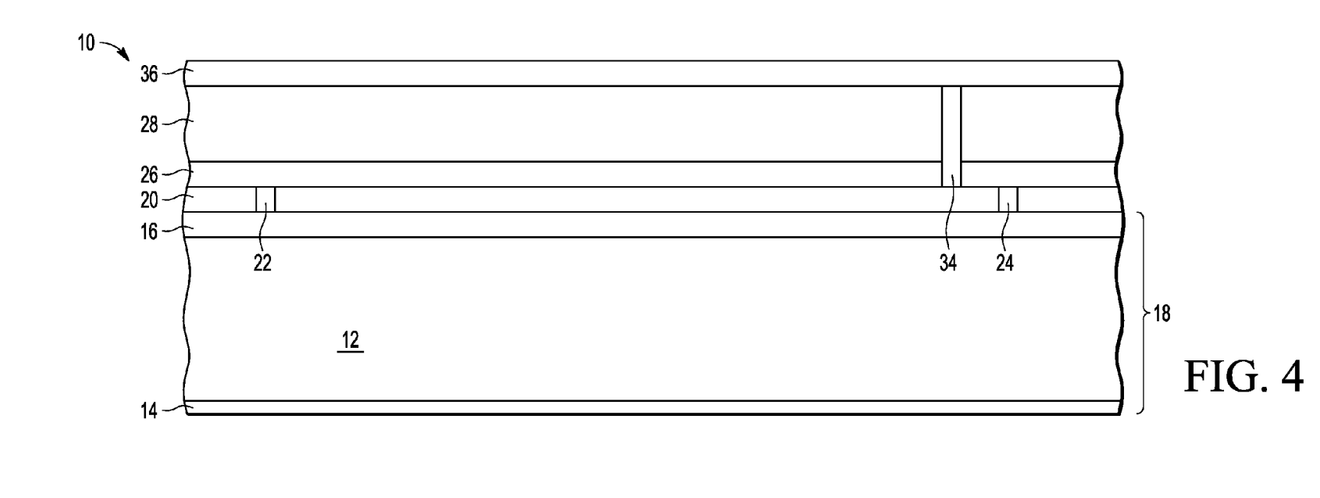

Next, as shown in FIG. 4, insulating layer 30 may be stripped and another insulating layer 36 may be formed. By way of example, insulating layer 36 may be formed by thermally oxidizing substrate 28. In one embodiment, insulating layer 30 may cover inter-layer via 34.

Figure 5:
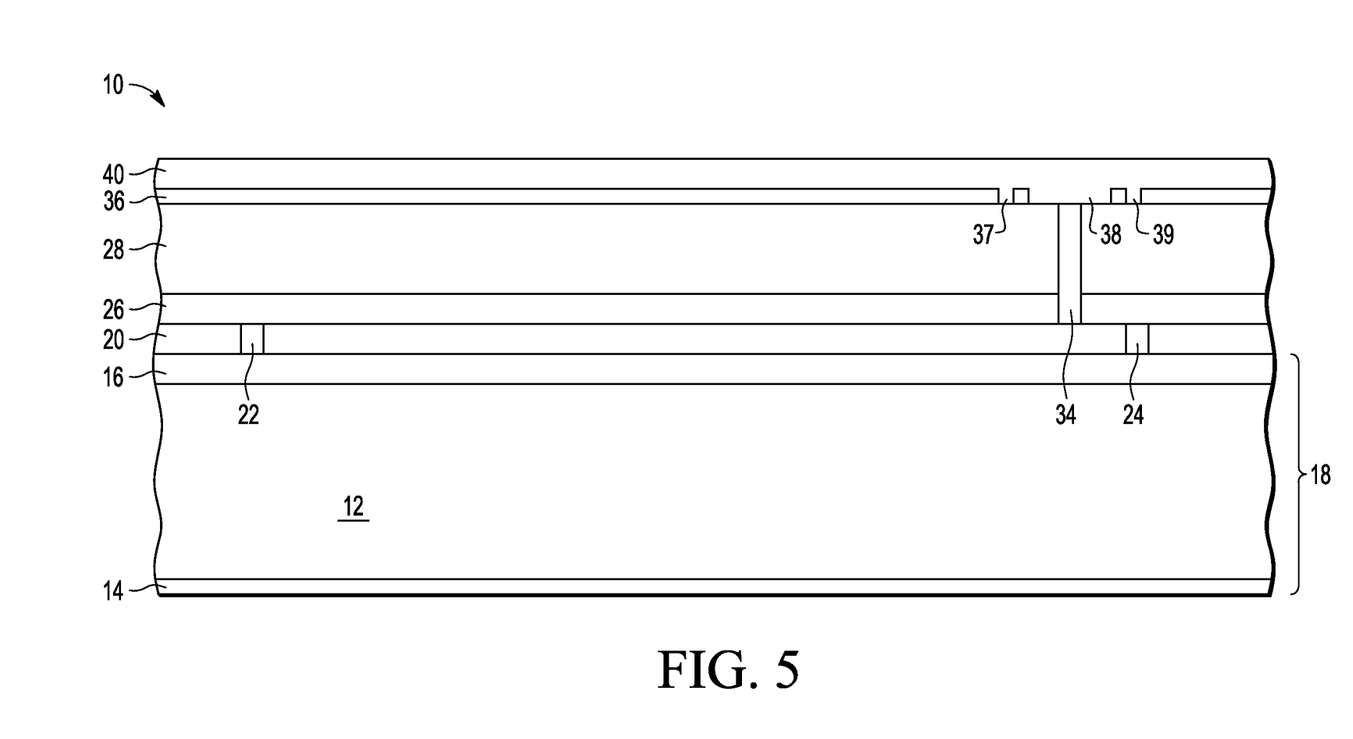

Next, as shown in FIG. 5, insulating layer 36 may be patterned and etched to form openings 37, 38, and 39. Opening 38 may be formed such that it is located directly above inter-layer via 34. Opening 37 may be formed such that it is located adjacent to opening 38, but is separated from opening 38 by a portion of insulating layer 36. Opening 39 may be formed such that it is located adjacent to opening 38, but is separated from opening 38 by a portion of insulating layer 36. In one embodiment, opening 37 may be located on one side of opening 38 and opening 39 may be located on the opposite side of opening 38. Openings 37 and 39 may be a part of a ring surrounding opening 38. Although FIG. 5 shows only three openings, additional openings may be formed, as needed. With continued reference to FIG. 5, polysilicon layer 40 may be formed over the remaining insulating layer 36, such that it is formed in inter-layer via 34, opening 37, opening 38, and opening 39.

Figure 6:
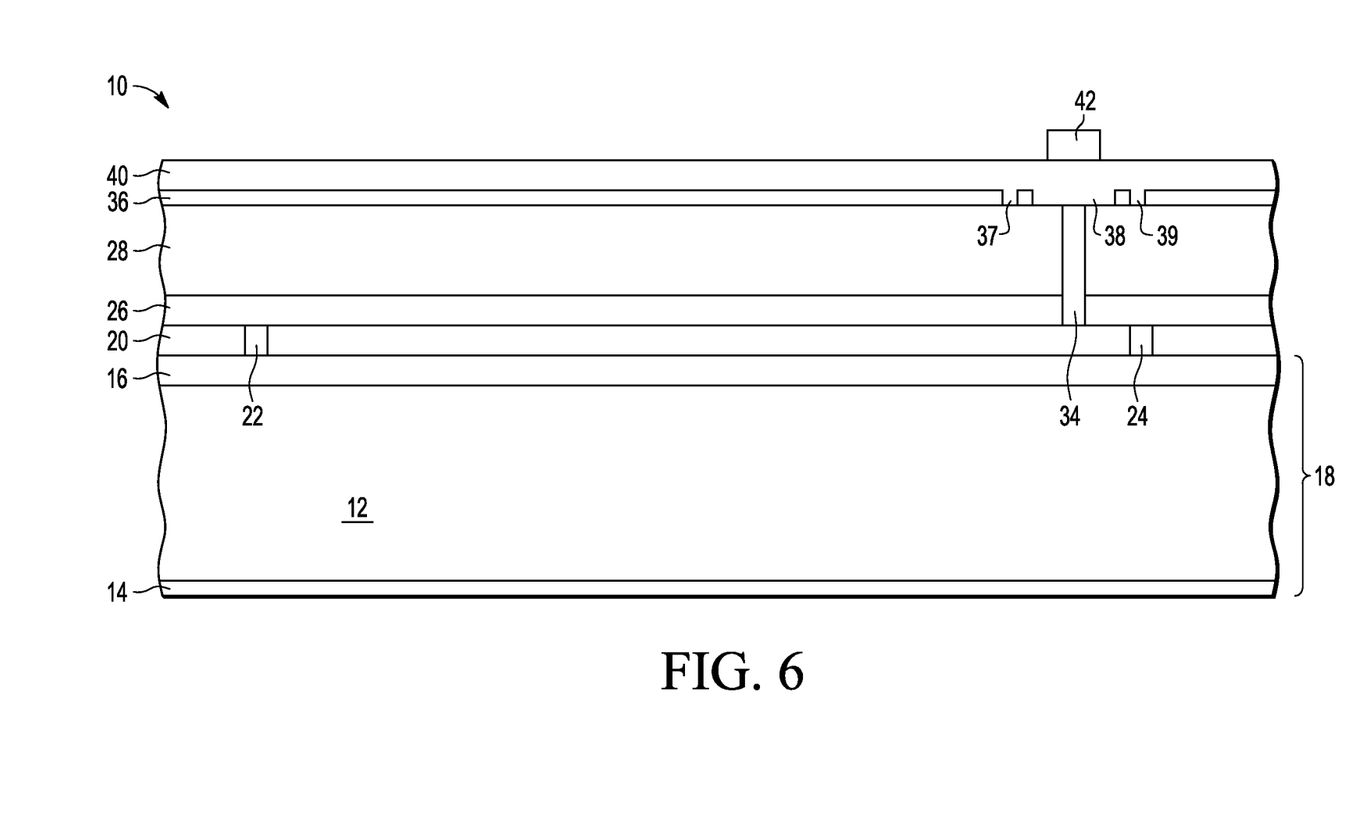

Next, as shown in FIG. 6, a bonding feature 42 may be formed over polysilicon layer 40. In one embodiment, bonding feature 42 may be formed by depositing a Germanium layer (not shown) over polysilicon layer 40 and then patterning and etching the Germanium layer. In one embodiment, bonding feature 42 may be formed such that it is located directly above opening 38. Although FIG. 6 shows only one bonding feature 42, additional bonding features may be formed, as needed.

Figure 7:
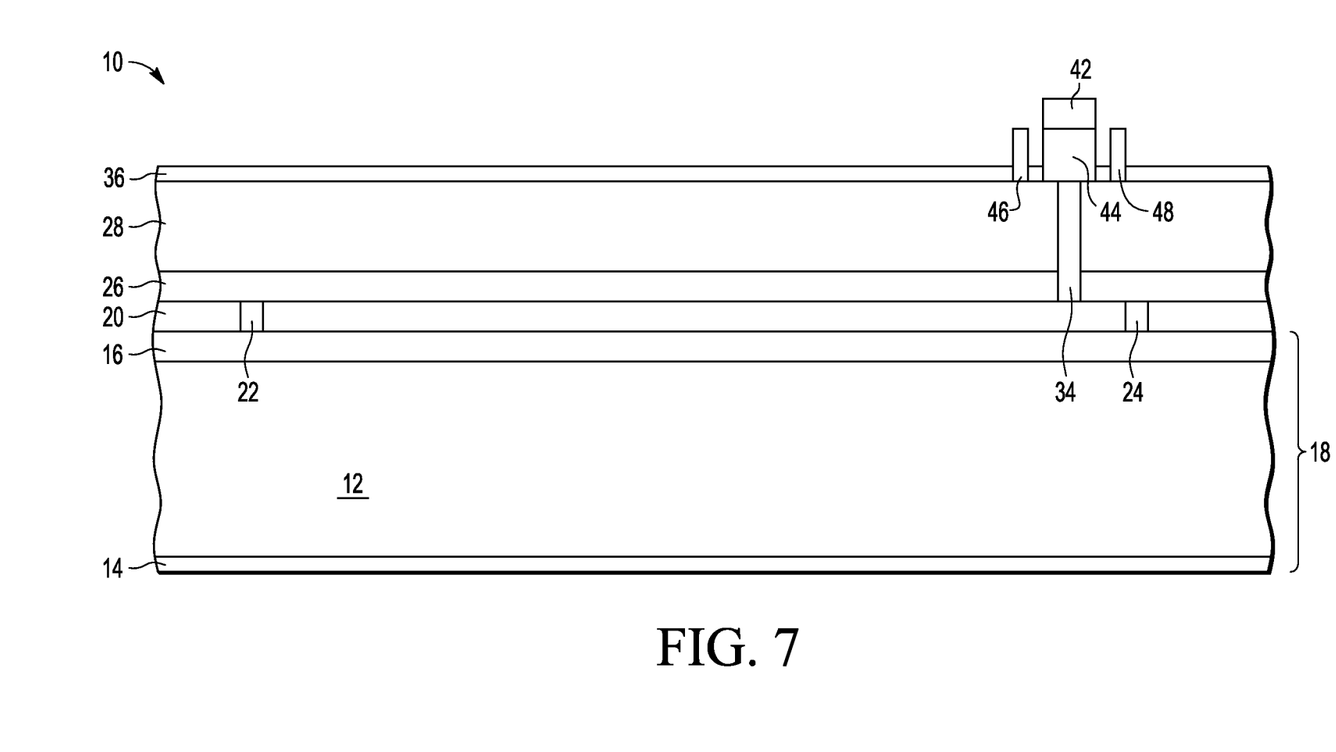

Next, as shown in FIG. 7, polysilicon layer 40 may be patterned and etched to form conduction portions 44, 46, and 48. Conductive portion 44 may be located directly below bonding feature 42. Conductive portion 46 may be adjacent to conductive portion 44 and may be separated from conductive portion 44 by a remaining portion of oxide layer 36. Conductive portion 48 may be adjacent to conductive portion 44 and may be separated from conductive portion 44 by another remaining portion of oxide layer 36. Bonding feature 42 may be in direct contact with inter-layer via 34 through conductive portion 44. Although FIG. 7 shows only conductive portions 44, 46, and 48, additional conductive portions may be formed, as needed.

Figure 8:
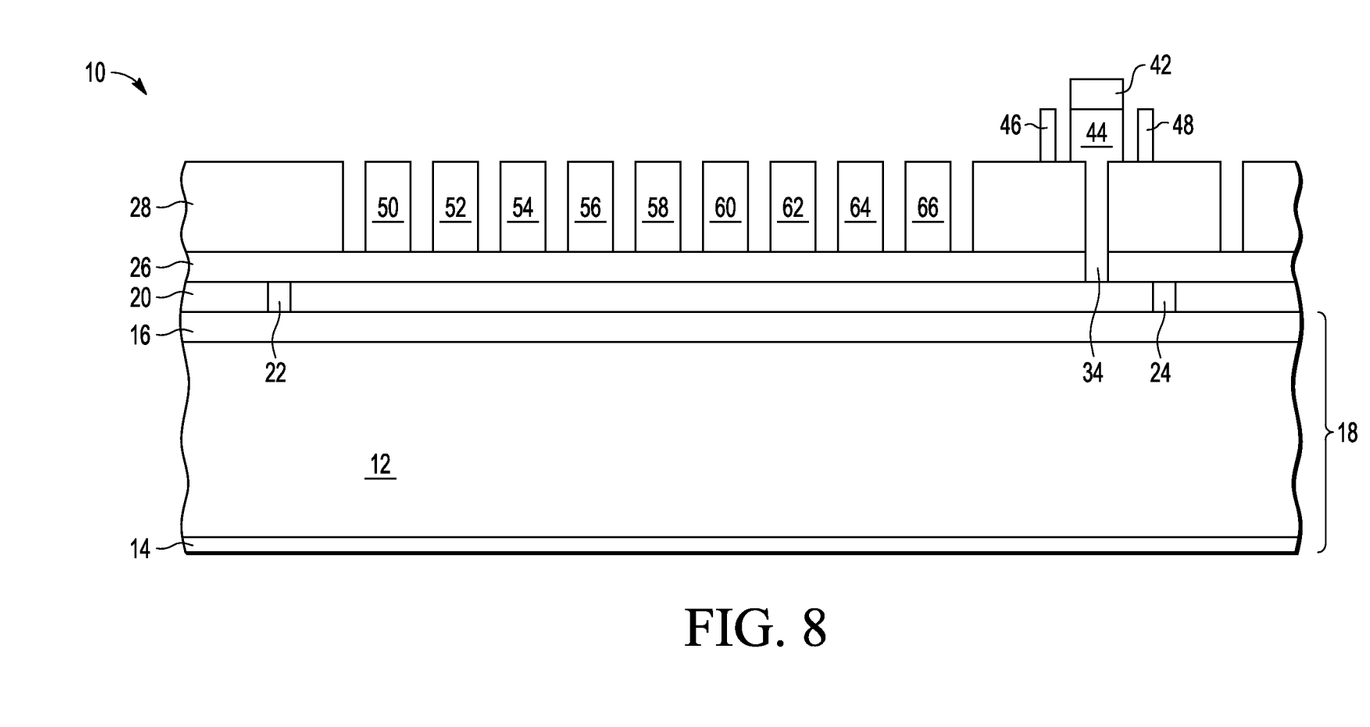

Next, as shown in FIG. 8, substrate 28 may be patterned and etched to form movable fingers 50, 52, 54, 56, 58, 60, 62, 64, and 66. By way of example, movable fingers 50, 52, 54, 56, 58, 60, 62, 64, and 66 may act as an active transducer or a movable mass of device structure 10 configured as a MEMS device.

Figure 9:
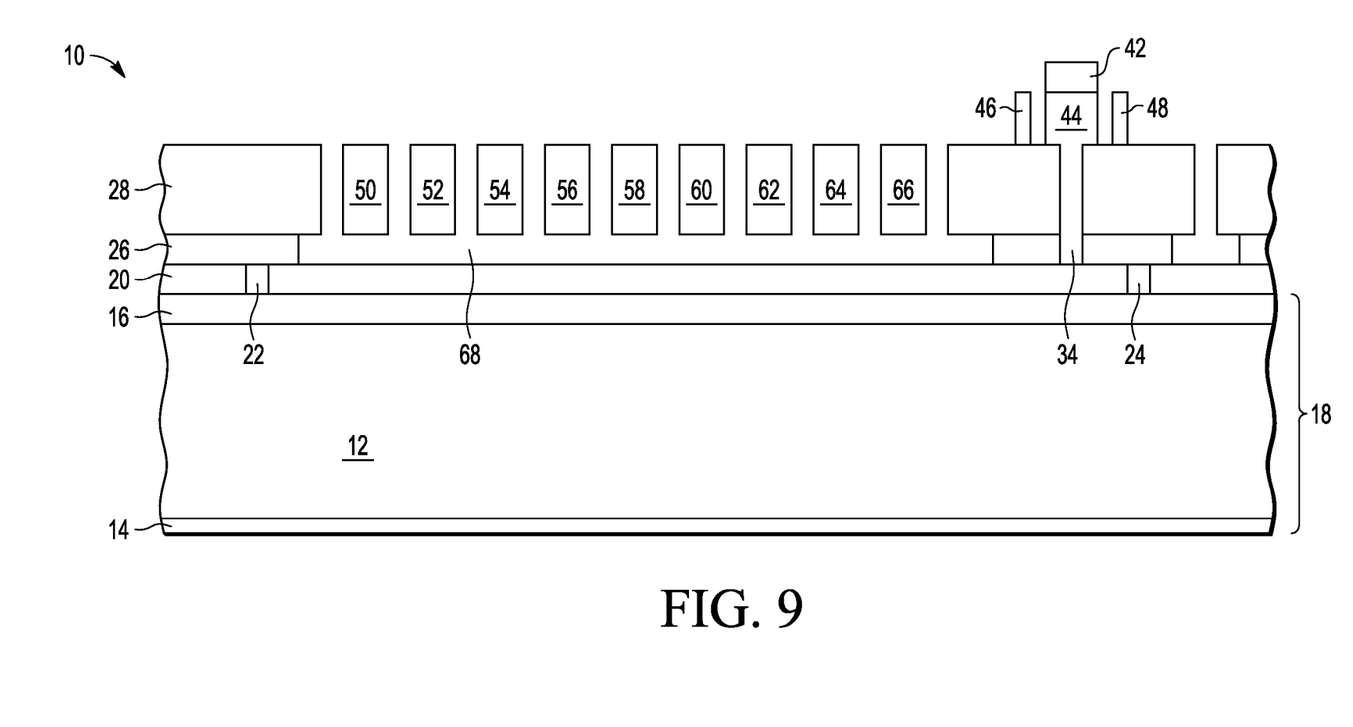

Next, as shown in FIG. 9, insulating layer 26 may be etched to release movable fingers 50, 52, 54, 56, 58, 60, 62, 64, and 66 such that they are free to move at least in one dimension. By way of example, vapor phase etching may be used to etch insulating layer 26.

Figure 10:
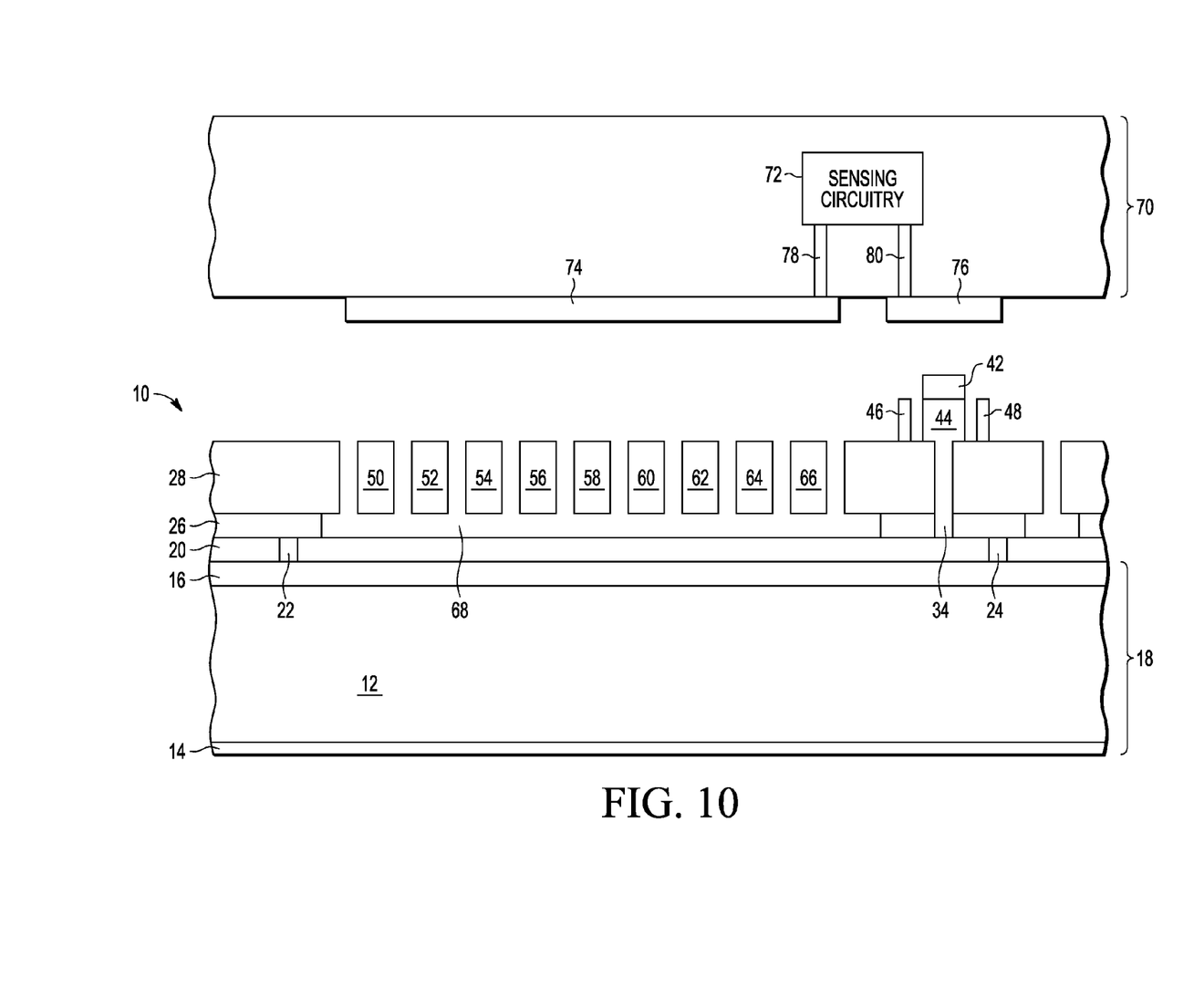

Next, as shown in FIG. 10, a capping wafer 70 may be prepared for bonding with wafer 18. As an example, this may include forming backend metal layers. In addition, as part of this step, an electrode 74 and a conductive portion 76 may be formed on a surface of wafer 70. In one embodiment, electrode 74 may act as a capacitor plate. Wafer 70 may include sensing circuitry 72. Alternatively, sensing circuitry 72 may be part of an ASIC that may be interconnected with wafer 70. Sensing circuitry 72 may be coupled to electrode 74 using a conductor 78. Conductive portion 76 may be coupled to sensing circuitry 72 using a conductor 80. Although FIG. 10 shows only conductors 78 and 80 for coupling electrode 74 and conductive portion 76, respectively, additional conductors, vias, and/or metal layers may also be used.

Figure 11:
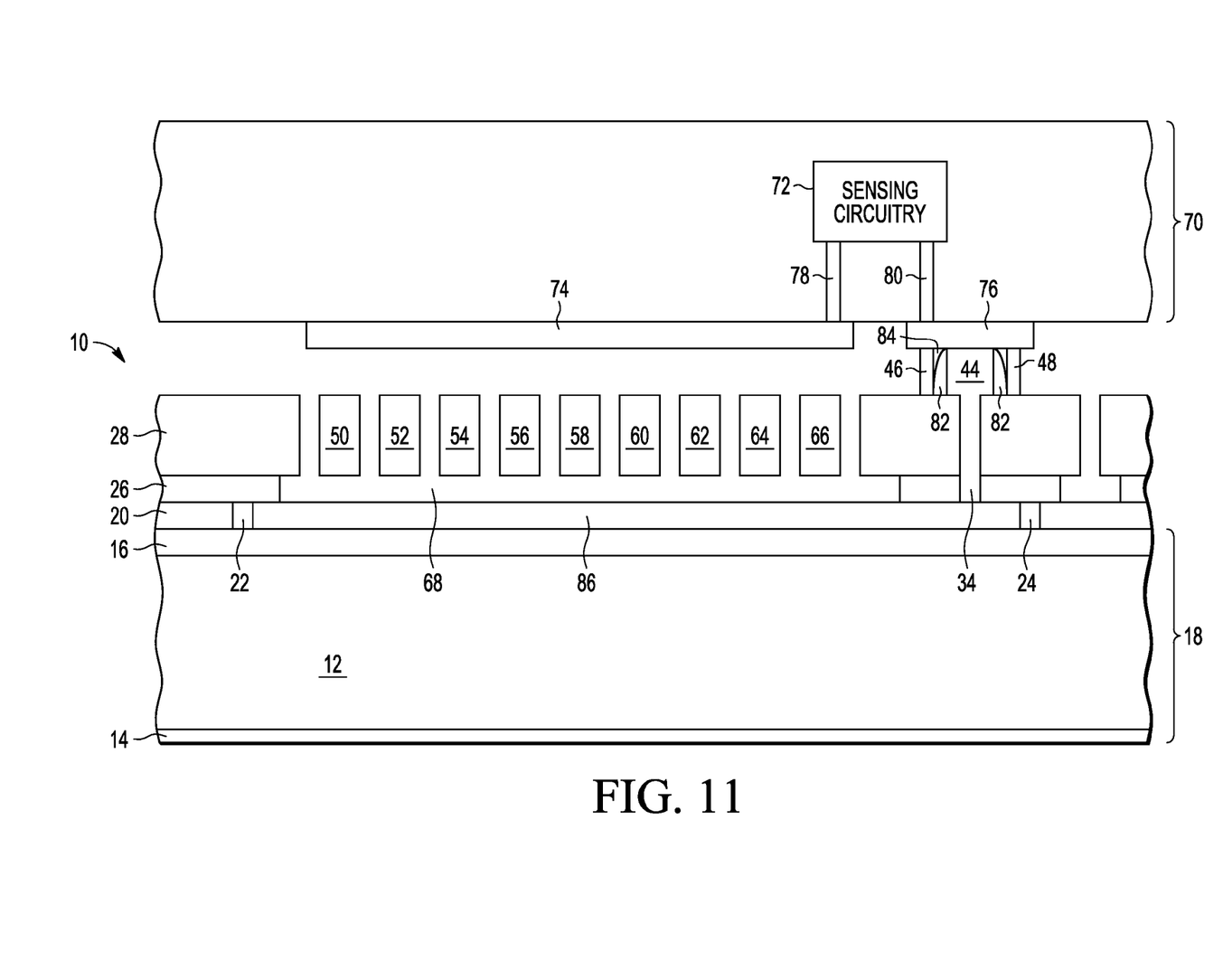

Next, as shown in FIG. 11, device structure 10 may be formed by bonding wafer 18 (or a portion of wafer 18) and the structure formed on it with capping wafer 70 (or a portion of capping wafer 70). In one embodiment, using vacuum bonding, a eutectic bond 82 is formed between conductive portion 76 and bonding feature 42, conductive portions 44, 46, and 48. As an example, the bond or contact is referred to as an adhesion contact. By way of example, bonding material 82 may flow into the openings between conductive portions 44 and 46 and conductive portions 44 and 48. By way of example, conductive portion 76 may be formed using Aluminum, such that an Al—Ge eutectic bond may be formed. Although FIG. 11 uses the example of a eutectic bond between Aluminum and Germanium, other materials may also be used. For example, bonding feature 42 may be formed using Aluminum. In that case by applying heat and pressure, a thermocompression Al—Al bond may be formed. As another example, an Au—Sn eutectic bond may also be formed. In one embodiment, wafer 18 and capping wafer 70 may be bonded such that electrode 74, also referred to as a conductive layer, is aligned to movable fingers 50, 52, 54, 56, 58, 60, 62, 64, and 66. Once wafer 18 and capping wafer 70 are bonded, two capacitors may be formed. First, a capacitor may be formed between electrode 86 (formed on wafer 18) and movable fingers 50, 52, 54, 56, 58, 60, 62, 64, and 66. Second, a capacitor may be formed between electrode 74 and movable fingers 50, 52, 54, 56, 58, 60, 62, 64, and 66. In one embodiment, sensing circuitry 72 may be configured to detect a difference between the capacitance values of the two capacitors.

Although the invention is described herein with reference to specific embodiments, various modifications and changes can be made without departing from the scope of the present invention as set forth in the claims below. For example, although the devices structure is shown as being made using the processing steps in a certain order, these steps need not be performed in the same order. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A device structure, comprising:
a substrate,
a first insulating layer on the substrate;
a conductive layer having an isolated conductive region separated from a remaining portion of the conductive layer by an opening in the conductive layer that surrounds the isolated conductive region;
a second insulating layer over the isolated conductive region having an opening over the isolated conductive region;
a movable conductive finger over the opening in the second insulating layer that forms a first capacitor with the isolated conductive region that varies in capacitance based on movement of the movable conductive finger;
conductive polysilicon running directly from a location on the isolated conductive region to a bonding feature above a top surface of the device structure, wherein the conductive polysilicon is orthogonal to a top surface of the isolated conductive region, wherein the bonding feature in contact with a cap wafer in which the cap wafer has an electrode over the movable finger to form a capacitance with the movable finger that varies inversely with variations in the capacitance of the first capacitor due to movement of the movable finger.

2. The device structure of claim 1, wherein the movable finger comprises polysilicon.

3. The device structure of claim 2, wherein the bonding feature comprises a first structure comprising germanium and a second structure comprising polysilicon.

4. The device structure of claim 3, wherein the movable finger has a top surface at the top surface of the device structure.

5. The device structure of claim 1, further comprising a plurality of movable fingers over the opening in the second insulating layer.

6. A semiconductor structure, comprising:
a first conductive layer formed over a first wafer;
an isolated conductive region formed in the first conductive layer surrounded by a first opening in the first conductive layer;
a second wafer comprising a first insulating layer and a conductive substrate, wherein the conductive substrate has a first major surface adjacent to the first insulating layer;
the first insulating layer attached to the isolated conductive region;
a thinned area of the conductive substrate that forms a second conductive layer;
a second opening formed through the second conductive layer and the first insulating layer to the isolated conductive region;
the second opening filled with a conductive plug wherein the conductive plug contacts the isolated conductive region;
the second conductive region configured to form a movable portion of the semiconductor structure over the isolated conductive region; and
a portion of the first insulating layer is removed under the movable portion of the semiconductor structure.

7. The structure of claim 6, further comprising a plurality of movable fingers formed as the movable portion of the device structure over the isolated conductive region.

8. The structure of claim 7, wherein:
each of the second conductive layer and the conductive plug comprises polysilicon;
the second conductive layer has a second major surface.

9. The structure of claim 8 further comprising an oxide layer over the second conductive layer and the conductive plug.

10. The structure of claim 9 further comprising an adhesion contact in contact with the conductive plug.

11. The structure of claim 10 further comprising the adhesion contact is in contact with a cap wafer that includes a conductive layer aligned to the plurality of movable fingers.

12. The structure of claim 10, further comprising:
a second portion of the oxide layer spaced away from the conductive plug; and
a bonding feature formed over the conductive plug and extending over a portion of the second portion of the oxide layer.

13. The structure of claim 12, further comprising a first conductive portion under the bonding feature and a second conductive portion where a third portion of the oxide layer was removed.

14. The structure of claim 13 further comprising the bonding feature and the first conductive portion contacting a contact on the cap wafer, wherein the cap wafer includes a conductive layer aligned to the plurality of movable fingers.

15. The structure of claim 14 wherein the contact, the conductive layer of the cap wafer, and the plurality of movable fingers are coupled to a sense circuitry.

16. A semiconductor device, comprising:
a first insulating layer formed over a semiconductor substrate;
a conductive polysilicon layer formed over the first insulating layer;
an opening in the conductive polysilicon layer surrounding a first portion of the conductive polysilicon layer;
a conductive silicon layer formed over the conductive polysilicon layer, wherein the conductive silicon layer is separated from the conductive polysilicon layer by a second insulating layer;
an opening extending orthogonally from a top surface of the first portion of the conductive polysilicon layer through the conductive silicon layer and the second insulating layer;
the opening in the silicon layer and the second insulating layer are filled with conductive polysilicon;
the conductive silicon layer is configured with a plurality of movable fingers over the first portion of the conductive polysilicon layer; and the second insulating layer is removed under the plurality of movable fingers.

\* \* \* \* \*